(12) United States Patent
Yoshie

(10) Patent No.: US 7,679,132 B2
(45) Date of Patent: Mar. 16, 2010

(54) SILICON CARBIDE SEMICONDUCTOR DEVICE AND MANUFACTURING METHOD THEREOF

(75) Inventor: Toru Yoshie, Tokyo (JP)

(73) Assignee: Oki Semiconductor Co., Ltd., Kanagawa (JP)

(*) Notice: Subject to any disclaimer, the term of this patent is extended or adjusted under 35 U.S.C. 154(b) by 45 days.

(21) Appl. No.: 12/037,110

(22) Filed: Feb. 26, 2008

(65) Prior Publication Data

US 2008/0224149 A1    Sep. 18, 2008

(30) Foreign Application Priority Data

Mar. 13, 2007    (JP)    ............... 2007-063768

(51) Int. Cl.
- *H01L 29/76* (2006.01)
- *H01L 31/062* (2006.01)
- *H01L 31/113* (2006.01)

(52) U.S. Cl. .................. 257/328; 257/77; 257/329; 438/268

(58) Field of Classification Search .......... 257/77, 257/328, 329, 341, E29.256–E29.261; 438/268
See application file for complete search history.

(56) References Cited

U.S. PATENT DOCUMENTS

| 4,593,302 A | * | 6/1986 | Lidow et al. .............. 257/342 |
| 5,915,180 A |   | 6/1999 | Hara et al. |
| 6,096,607 A | * | 8/2000 | Ueno ...................... 438/268 |

FOREIGN PATENT DOCUMENTS

| JP | 2000195968 | 7/2000 |
| JP | 2000223562 | 8/2000 |
| JP | 2006228901 | 8/2006 |

* cited by examiner

*Primary Examiner*—Theresa T Doan
(74) *Attorney, Agent, or Firm*—Volentine & Whitt, PLLC

(57) ABSTRACT

A silicon carbide semiconductor device includes a semiconductor substrate containing silicon carbide, a semiconductor layer formed over the semiconductor substrate, and a plurality of well regions formed on a front surface side of a cell forming area set to the semiconductor layer. The device further includes source layers formed on the front surface side lying within the well regions, an outer peripheral insulating film thick in thickness, which is formed over the semiconductor layer in an outer peripheral area surrounding the cell forming area, a gate oxide film formed over the front surface of the semiconductor layer in the cell forming area, and a gate electrode layer formed so as to extend from above the gate oxide film to above the outer peripheral insulating film.

7 Claims, 9 Drawing Sheets

US 7,679,132 B2

SILICON CARBIDE SEMICONDUCTOR DEVICE AND MANUFACTURING METHOD THEREOF

BACKGROUND OF THE INVENTION

The present invention relates to a silicon carbide semiconductor device such as a vertical power MOSFET designed for bulk power, formed in a silicon carbide substrate, and a manufacturing method thereof.

A silicon carbide semiconductor device using a silicon carbide (SiC) crystal has a feature that it is excellent in electrical withstand-voltage characteristic and resists operations at high temperatures as compared with a normal semiconductor device using a silicon (Si) crystal.

This is because as a result that the interatomic interval becomes shorter since the carbon (C) atom is contained, stronger interatomic bonding is obtained and the bandgap becomes larger than double, so that the withstand voltage characteristic is enhanced up to an electric field of more than double and the semiconductor characteristic is kept up to high temperatures.

A MOSFET (Metal Oxide Semiconductor Field Effect Transistor) used as a conventional vertical silicon carbide semiconductor device using such a property of silicon carbide includes an N+ semiconductor substrate comprised of silicon carbide, in which an N-type conductive impurity is diffused in a high concentration, an N− semiconductor layer formed on the N+ semiconductor substrate, in which the N-type conductive impurity is diffused in a low concentration, a plurality of p-well regions formed by diffusing a P-type conductive impurity on the front surface side of a cell forming area set to the N− semiconductor layer, source layers formed on the front surface side in the p-well regions, in which the N-type conductive impurity is diffused in a high concentration, an outer peripheral insulating film comprised of silicon oxide ($SiO_2$), thicker than a gate oxide film formed on the N− semiconductor layer in an outer peripheral area surrounding the cell forming area by a CVD (Chemical Vapor Deposition) method, an outer peripheral P-well layer which extends from an outer peripheral portion of the cell forming area to the outer peripheral area and is formed by diffusing the P-type conductive impurity on the front surface side of the N− semiconductor layer, a gate oxide film comprised of silicon oxide, which is formed on the front surface of the N− semiconductor layer in the cell forming area by a thermal oxidation method, a gate electrode layer comprised of polysilicon, which is formed so as to extend from above the gate oxide film to above the outer peripheral insulating film, an interlayer insulating film formed on the gate electrode layer, a source electrode pad and a gate electrode pad formed on the interlayer insulating film, which are connected via contact plugs reaching the source layers and the gate electrode layer through the interlayer insulating film, and a drain electrode formed on the back surface of the N+ semiconductor substrate (refer to, for example, a patent document 1 (Japanese Unexamined Patent Publication No. 2004-288890 (mainly paragraphs 0014 in the 5th page-0019 in the 6th page, paragraph 0022 in the 7th page, and FIG. 1)).

In this case, a high electric field of a few 100V to a few 10 kV is applied to a silicon carbide material between the source and drain formed in a vertical direction. The turning ON and OFF of the MOSFET is controlled by a voltage of a few 10V applied to the gate electrode layer. At this time, an electric field strength of about 3 MV/cm at maximum is generally applied to the gate oxide film.

On the other hand, as a vertical trench gate type MOSFET, there has been known one in which an amorphous layer of silicon carbide is formed at the bottom of each trench provided between source layers, the amorphous layer is subjected to speed-increasing oxidation upon thermal oxidation for forming a gate oxide film thereby to make the gate oxide film at each trench bottom thicker, and the gate oxide film that makes the side face of each trench thinner is formed (refer to, for example, a patent document 2 (Japanese Unexamined Patent Publication No. 2006-228901 (mainly paragraphs 0020-0021 in the 7th page, and FIG. 2)).

There has also been known one in which in order to prevent thinning of a gate oxide film due to a step at the boundary between both a device isolation insulating layer embedded into each trench made or created where the device isolation insulating layer is formed in a silicon substrate by an STI method, and the silicon substrate, ions having speed-increasing oxidation action are implanted in a corner portion between the trench and a front surface of the silicon substrate, and the corner portion is subjected to speed-increasing oxidation when the gate oxide film is formed by a thermal oxidation method, thereby forming the gate oxide film at the corner portion thicker (refer to, for example, a patent document 3 (Japanese Unexamined Patent Publication No. 2000-223562 (mainly paragraphs 0061 in the 6th page-0068 in the 7th page, FIG. 8 and FIG. 9)).

Further, there has been known one in which when gate oxide films different in thickness are formed on a silicon substrate, Argon (Ar) ions are implanted in a front surface of the silicon substrate on the film-thickening side to make amorphization thereof, and the amorphized front surface of the silicon substrate is subjected to speed-increasing oxidation when the gate oxide films are formed by a thermal oxidation method, thereby forming the gate oxide films different in thickness (refer to, for example, a patent document 4 (Japanese Unexamined Patent Publication No. 2000-195968 (mainly paragraphs 0031 in the 4th page-0042 in the 5th page, and FIGS. 1 through 6)).

In the prior art according to the patent document 1, however, the outer peripheral insulating film comprised of silicon oxide, which is thicker than the gate oxide film in thickness, is formed on the N− semiconductor layer in the outer peripheral area that surrounds the cello forming area. The gate oxide film comprised of silicon oxide is formed on the front surface of the N− semiconductor layer in the cell forming area by the thermal oxidation method. The gate electrode layer comprising polysilicon is formed so as to extend from above the gate oxide film to above the outer peripheral insulating film. Therefore, when, as illustrated in a typical view of a conventional vertical silicon carbide MOSFET shown in FIG. 9, a thick outer peripheral insulating film 104 comprised of silicon oxide is formed on an N− semiconductor layer 103 in an outer peripheral area 102 surrounding a cell forming area 101 in a silicon carbide semiconductor device 100, and a gate oxide film 105 comprised of silicon oxide is formed on the front surface of the N− semiconductor layer 103 in the cell forming area 101 surrounded by the outer peripheral insulating film 104 by a thermal oxidation method, the N− semiconductor layer 103 is oxidized and its oxidation proceeds in its thickness direction. Hence, a concave portion 106 having a depth equivalent to about one-half the thickness of the gate oxide film 105 is formed as illustrated in an enlarged view of a portion Z shown in FIG. 10.

A problem arises in that since the outer peripheral insulating film 104 is formed of silicon oxide and an end face 104a or the like of the outer peripheral insulating film 104 is not oxidized, the thickness T of the gate oxide film 105 at the boundary between a gate electrode layer 107 formed so as to extend from above the gate oxide film 105 to above the outer peripheral insulating film 104, and the outer peripheral insulating film 104 at a rise portion of the gate electrode layer 107 becomes a thickness equivalent to about one-half the thickness Tg of the gate oxide film 105, and hence an electric field concentrates on an edge portion of the gate oxide film 105 adjacent to the outer peripheral insulating film 104 at which the gate oxide film 105 is made thin, thereby to cause dielectric breakdown, thus shortening insulation withstand-voltage or breakdown lifetime of the gate oxide film 105 and degrading the reliability of the silicon carbon semiconductor device 100.

Incidentally, since the growth rate of a thermal oxide film is slow in the case of a silicon carbide substrate as compared with a silicon substrate (it is an oxidation rate of a few % to a few 10% of that at the silicon substrate), it is not a common practice to use a LOCOS (Local Oxidation of Silicon) method where a thick insulating film comprised of silicon oxide is formed. When, however, a MOSFET having a configuration similar to the above is formed in a silicon substrate 201 as shown in FIG. 11, each device isolation insulating layer 202 is formed by the LOCOS method. Upon its formation, the tip or leading end of the device isolation insulating layer 202 enters a silicon layer in a cell forming area 203, so that a bird's peak 204 having an approximately triangular sectional shape, which consists of silicon oxide, is formed at a boundary portion. Thus, even though when a gate oxide film 205 is formed by a thermal oxidation method, the front surface of the silicon substrate 201 is oxidized and its oxidation proceeds in its thickness direction, the end of the gate oxide film 205 is formed adjacent to the bird's peak 204, and the thickness of the gate oxide film 205 at the boundary between both a gate electrode layer 207 formed so as to extend over an outer peripheral insulating film 206 formed on the corresponding device isolation insulating layer 202 from above the gate oxide film 205, and an outer peripheral insulating film 206 at a rise portion of the gate electrode layer 207 is not made thinner than the thickness Tg of the gate oxide film 205. Thus, the above-described problem does not occur because the field concentration referred to above is relaxed.

SUMMARY OF THE INVENTION

The present invention has been made to solve the above problems. An object of the present invention is to provide means that prevents dielectric breakdown of a gate oxide film adjacent to an outer peripheral insulating film formed in an outer peripheral area of a silicon carbide semiconductor device.

According to one aspect of the present invention, for attaining the above object, there is provided a silicon carbide semiconductor device comprising a semiconductor substrate comprising silicon carbide, which contains a first conductivity type impurity diffused therein in a high concentration, a semiconductor layer formed over the semiconductor substrate and containing the first conductivity type impurity diffused therein in a low concentration, a plurality of well regions formed on a front surface side of a cell forming area set to the semiconductor layer and in which a second conductivity type impurity corresponding to a type opposite to the first conductivity type impurity is diffused, source layers formed on the front surface side lying within the well regions and each containing the first conductivity type impurity diffused therein in a high concentration, an outer peripheral insulating film thick in thickness, which is formed over the semiconductor layer in an outer peripheral area surrounding the cell forming area, a gate oxide film formed over the front surface of the semiconductor layer in the cell forming area, and a gate electrode layer formed so as to extend from above the gate oxide film to above the outer peripheral insulating film, wherein each of steplike portions adjacent to the outer peripheral insulating film and thicker than the gate oxide film in thickness is provided at an edge portion of the gate oxide film.

Thus, the present invention can bring about advantageous effects in that an electric filed concentrated on an edge portion of a gate oxide film adjacent to an outer peripheral insulating film at a portion of the rise of a gate electrode layer extending from above the gate oxide film in a cell forming area to above the outer peripheral insulating film formed in an outer peripheral area is relaxed to enable prevention of dielectric breakdown of the gate oxide film, thereby making it possible to improve insulation withstand-voltage or breakdown lifetime of the gate oxide film and enhance the reliability of a silicon carbide semiconductor device.

BRIEF DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

DETAILED DESCRIPTION OF THE PREFERRED EMBODIMENTS

Preferred embodiments of a silicon carbide semiconductor device according to the present invention will hereinafter be described with reference to the accompanying drawings.

First Preferred Embodiment

Figure 1:
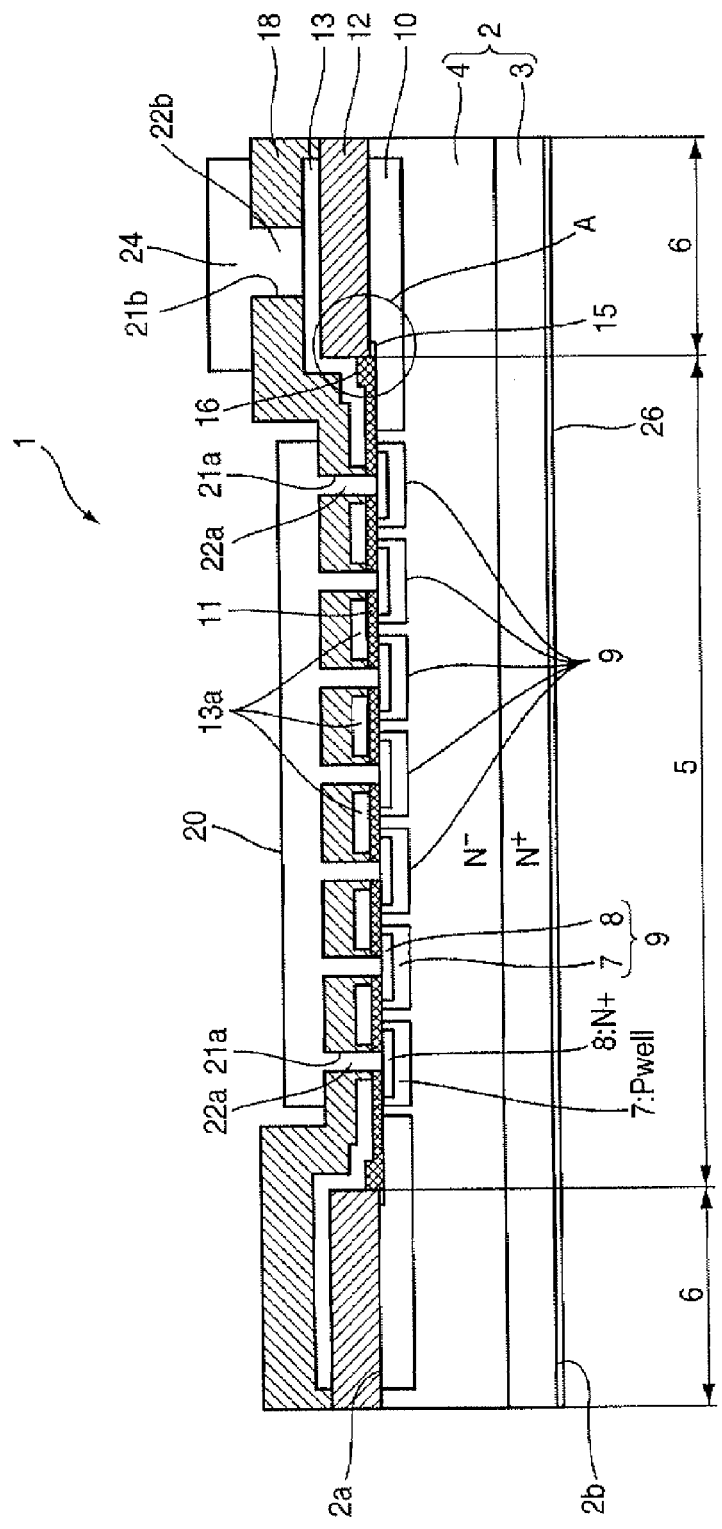
FIG. 1 is an explanatory view showing a section of a vertical AMOS transistor according to a first embodiment.
Figure 2:
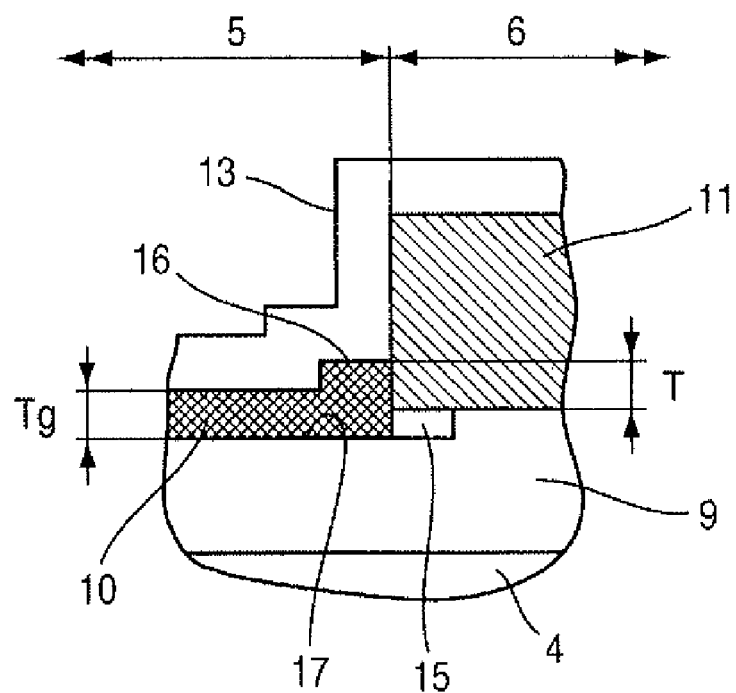
FIG. 2 is an enlarged view illustrating a portion A shown in FIG. 1.
Figure 3:
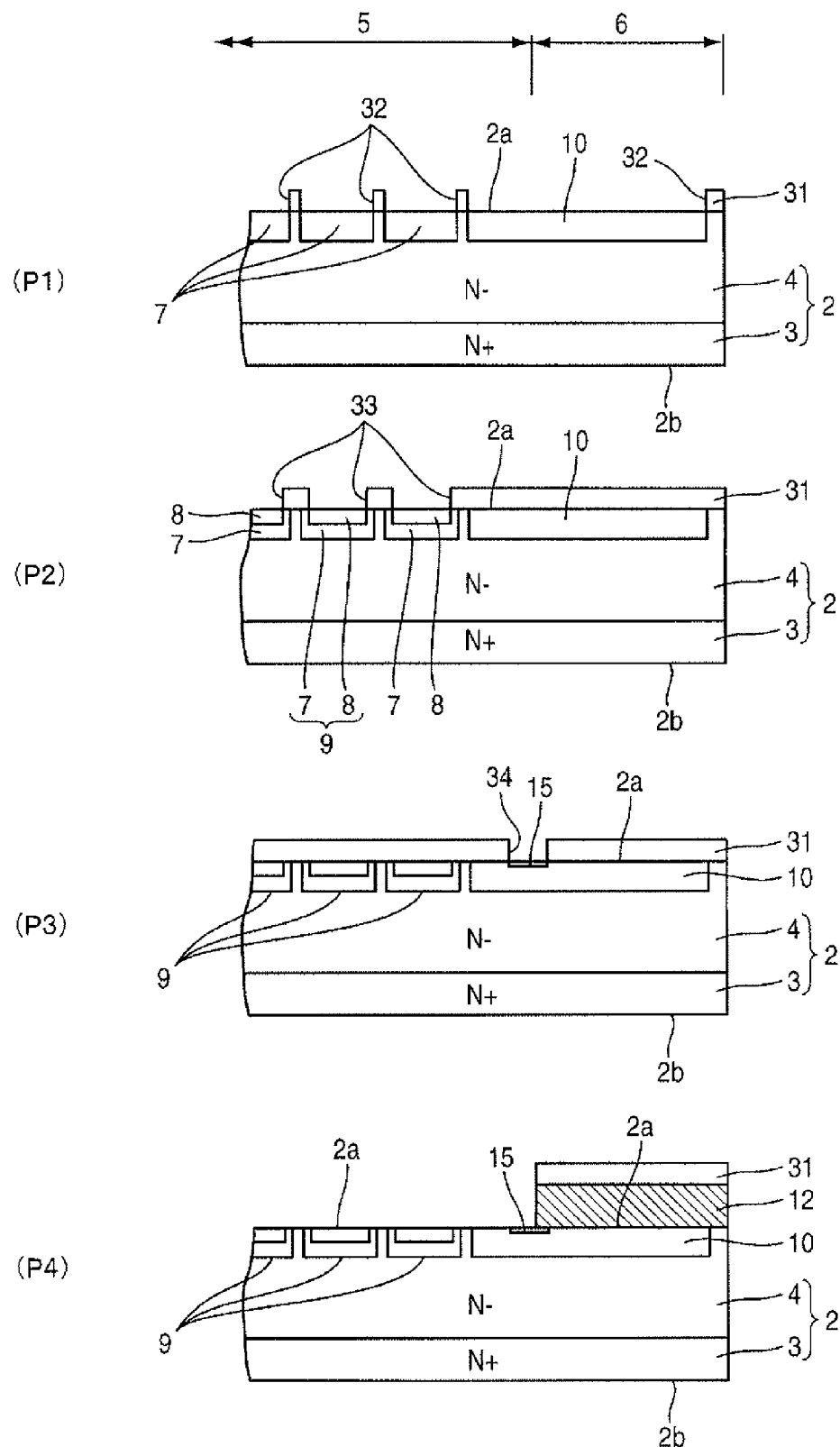
FIG. 3 is an explanatory view showing a method for manufacturing the vertical nMOS transistor according to the first embodiment.
Figure 4:
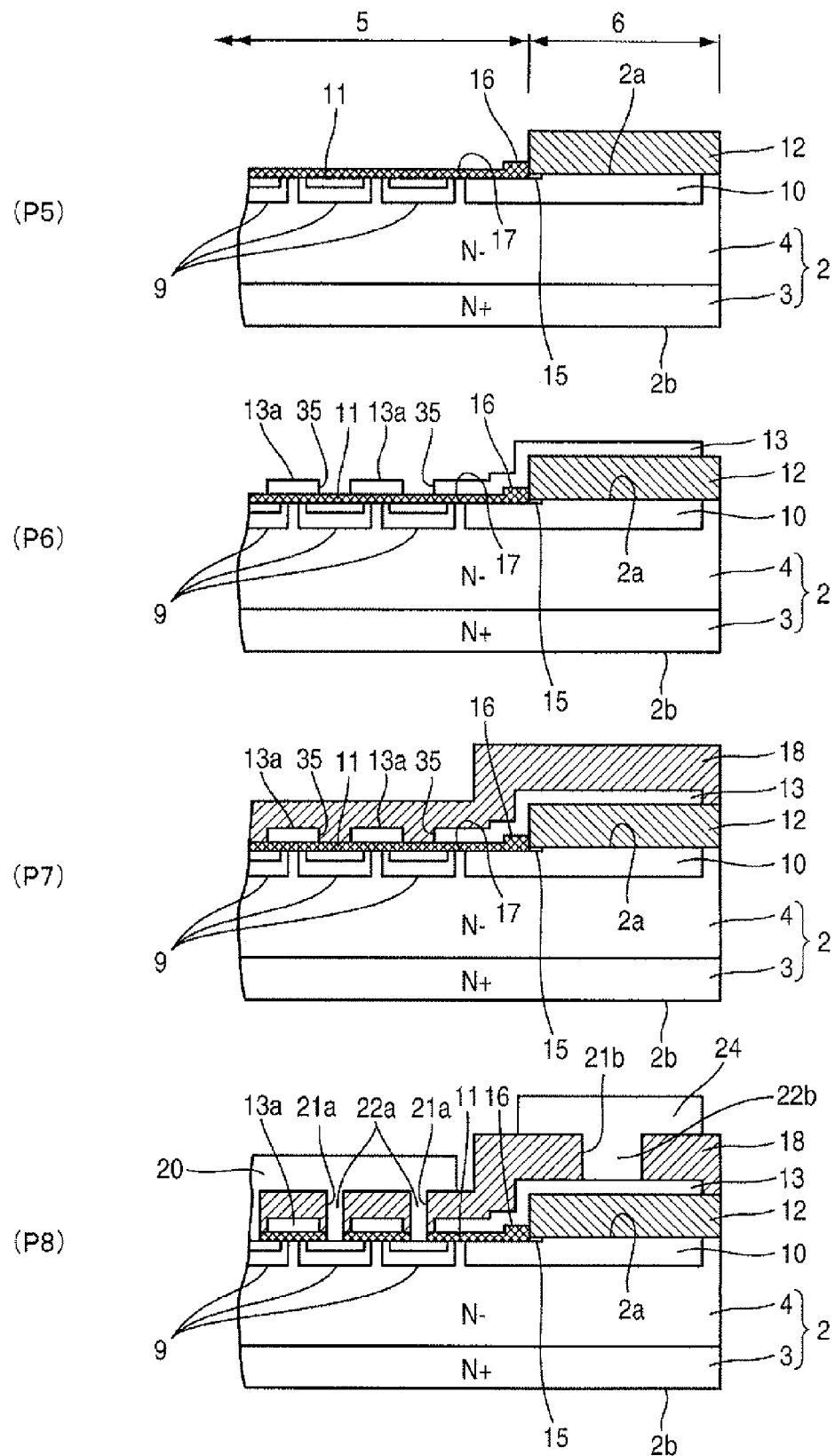
FIG. 4 is an explanatory view showing the method for manufacturing the vertical nMOS transistor according to the first embodiment.

FIG. 1 is an explanatory view showing a section of a vertical nMOS transistor according to a first embodiment, FIG. 2 is an enlarged view illustrating a portion A shown in FIG. 1, and FIGS. 3 and 4 are respectively explanatory views showing a method for manufacturing the vertical nMOS transistor according to the first embodiment.

Reference numeral 1 indicates a vertical nMOS transistor (hereinafter called simply "nMOS") used as a silicon carbide semiconductor device.

Reference numeral 2 indicates a silicon carbide substrate, which is a substrate having a crystal polymorph or polymorphism of 4H, in which silicon carbide is epitaxially grown on an N+ semiconductor substrate 3 made up of single-crystal silicon carbide, in which an N-type conductive impurity (hereinafter called "N-type impurity") such as phosphorus (P), nitrogen (N) or the like used as a first conductivity type impurity is diffused in a relatively high concentration, thereby to form an N− semiconductor layer 4 in which the N-type impurity is diffused in a low concentration.

A cell forming area 5 formed with a plurality of cells 9 (to be described later) and an outer peripheral area 6 that surrounds the cell forming area 5 are set to the silicon carbide substrate 2 according to the present embodiment.

A plurality of P-well regions 7 in which a P-type conductive impurity (hereinafter called "P-type impurity") such as aluminum (Al), boron (B) or the like used as a second conductivity type impurity corresponding to a type opposite to the N-type impurity is diffused in a relatively low concentration, are formed on the front surface 2a side of the N− semiconductor layer 4 in the cell forming area 5. Source layers 8 in which the N-type impurity is diffused in a relatively high concentration, are formed on the front surface 2a side lying in the P-well regions 7.

These P-well regions 7 and the source layers 8 formed therein form respective one cells 9 employed in the present embodiment.

Outer peripheral P-well layers 10, which respectively extend from an outer peripheral portion of the cell forming area 5 to the outer peripheral area 6 and in which the P-type impurity is diffused to the same degree as the P-well regions 7, are formed on the front surface 2a side of the N− semiconductor layer 4 at the outer peripheral portion of the cell forming area 5 and the outer peripheral area 6. An outer peripheral insulating film 12 comprised of silicon oxide thicker than a gate oxide film 11 is formed over the N− semiconductor layer 4 in the outer peripheral area 6 that surround the cell forming area 5.

The gate oxide film 11 is an insulating film having a relatively thin thickness, which consists of silicon oxide formed by oxidizing the entire surface of the front surface 2a of the N− semiconductor layer 4 in the cell forming area 5 by a thermal oxidation method.

Reference numeral 13 indicates a gate electrode layer, which is a conductive layer having conductivity, in which the N-type impurity is diffused into polysilicon in a relatively high concentration. The gate electrode layer 13 extends from above the gate oxide film 11 to above the outer peripheral insulating film 12 and is formed on the outer peripheral insulating film 12 over its overall circumference. Portions opposite to the adjoining source layers 8 through the gate oxide film 11 interposed therebetween function as gate electrodes 13a. When a voltage is applied to the gate electrodes 13a, channels are formed on the front surface 2a side of the P-well regions 7 opposite to the gate electrodes 13a.

Reference numeral 15 indicates an amorphous layer, which is formed as shown in FIG. 2 by injecting an inert gas such as Argon, Neon (Ne) or the like used as a non-amorphization impurity in a frame-shaped area having a predetermined width (corresponding to a width of 10 μm or less set in consideration of an alignment allowance upon formation of a resist mask 31 at a process step or process P4 to be described later in the present embodiment) containing the boundary between the cell forming area 5 and the outer peripheral area 6, of the front surface 2a for the outer peripheral P-well layers 10 formed in the N− semiconductor layer 4, to an extent equivalent to the thickness Tg (50 nm in the present embodiment) of the gate oxide film 11 (refer to FIG. 3 (P3)). The amorphous layer 15 has such a characteristic (speed-increasing oxidation characteristic) that the growth rate of an oxide film at thermal oxidation becomes faster than that at the silicon carbide.

Reference numerals 16 indicate steplike portions each formed in the gate oxide film 11. The steplike portion is a protruded portion of the gate oxide film 11, which is formed in a protruded fashion using the speed-increasing oxidation characteristic of the amorphous layer 15 when the front surface 2a of the N− semiconductor layer 4 is oxidized by the thermal oxidation method and which consists of silicon oxide thicker than the gate oxide film 11 and thinner than the outer peripheral insulating film 12. The steplike portion 16 is formed in a region (called "edge portion of gate oxide film 11") of the gate oxide film 11 adjacent to the outer peripheral insulating film 12 at the portion of the rise of the gate electrode layer 13 to the outer peripheral insulating film 12.

Reference numeral 17 indicates a concave portion that is formed by causing oxidation to proceed in the direction of thickness of the N− semiconductor layer 4 when the front surface 2a of the N− semiconductor layer 4 is oxidized by the thermal oxidation method to form the gate oxide film 11. The concave portion 17 has a depth corresponding to about half the thickness Tg of the gate oxide film 11.

Reference numeral 18 indicates an interlayer insulating film, which is a thick insulating film made up of an insulating material such as silicon oxide, which covers the respective portions such as the gate electrode layer 13, etc. formed on the front surface 2a side of the silicon carbide substrate 2.

Reference numeral 20 indicates a source electrode pad, which is formed by patterning a conductor layer comprised of a conductive material such as aluminum or tungsten (W) formed in the cell forming area 5 on the interlayer insulating film 18 and is electrically connected to the respective source layers 8 via contact plugs 22a formed by embedding the same conductive material as the source electrode pad 20 into contact holes 21a formed as through holes that extend through the interlayer insulating film 18 and the gate oxide film 11 and reach the source layers 8.

Reference numeral 24 indicates a gate electrode pad, which is formed by patterning a conductor layer constituted of the same conductive material as the source electrode pad 20, formed in the outer peripheral area 6 on the interlayer insulating film 18 and is electrically connected to the gate electrode layer 13 via a contact plug 22b formed by embedding the same conductive material as the gate electrode pad 24 into its corresponding contact hole 21b formed as a through hole that reaches the gate electrode layer 13 through the interlayer insulating film 18.

Reference numeral 26 indicates a drain electrode, which is an electrode formed by depositing the same conductive material as the source electrode pad 20 on the back surface of the N+ semiconductor substrate 3.

In FIGS. 3 and 4, reference numeral 31 indicates a resist mask used as a mask member, which is a mask pattern formed by subjecting a positive or negative resist applied to the upper surface side of the silicon carbide substrate 2 by photolithography using a spin coat method or the like to exposure and development processing. The resist mask functions as a mask in an etching process step and an ion implantation process step or the like employed in the present embodiment.

A method for manufacturing the nMOS according to the present embodiment will be explained below in accordance with processes indicated by P in FIG. 4.

At P1 (FIG. 3), a silicon carbide substrate 2 to which the above-mentioned cell forming area 5 and outer peripheral area 6 are set is prepared. A resist mask 31 having openings 32 which expose an N− semiconductor layer 4 for areas for forming respective P-well regions 7 and an outer peripheral P-well layer 10, is formed in a front surface 2a of the silicon carbide substrate 2 by photolithography. With it as a mask, P-type impurity (phosphorus in the present embodiment) ions are implanted therein to form on the front surface 2a side of the N− semiconductor layer 4, P-well regions 7 and an outer peripheral P-well layer 10 in which a P-type impurity is diffused in a low concentration.

At P2 (FIG. 3), the resist mask 31 formed at the process P1 is removed, and a resist mask 31 having openings 33 that expose the N− semiconductor layer 4 for areas for forming respective source layers 8 by photolithography is formed. With it as a mask, N-type impurity (aluminum in the present embodiment) ions are implanted therein to form on the front surface 2a side for the respective P-well regions 7, source layers 8 in which an N-type impurity is diffused in a low concentration, and form a plurality of cells 9 in the cell forming area 5.

Incidentally, if necessary, then additional ion implantation aimed to carry out an adjustment to the threshold value of a transistor, a reduction in the resistance of contact with the silicon carbide substrate 2, a surface field relaxation guard ring, and the like at the processes P1 to P2.

At P3 (FIG. 3), the resist mask 31 formed at the process P2 is removed, and heat treatment for activation at a range of about 1200° C. to 1800° C. is done. Thereafter, a resist mask 31 having an opening 34 that exposes the N− semiconductor layer 4 for an area for forming a frame-shaped amorphous layer 15 having a predetermined width containing the boundary between the cell forming area 5 and the outer peripheral area 6, is formed by photolithography. With is as a mask, inert gas (Argon in the present embodiment) ions are implanted therein to form an amorphous layer 15 in which the front surface 2a side of the outer peripheral P-well layer 10 is amorphized at a depth of about a thickness Tg of a gate oxide film 11.

At P4 (FIG. 3), the resist mask 31 formed at the process P3 is removed, and the silicon carbide substrate 2 is heated up to about 400° C. Silicon oxide is deposited over the entire upper surface of the N− semiconductor layer 4 by a plasma CVD method using a mixed gas of tetraethoxysilane (TEOS) and oxygen ($O_2$) to form a thick insulating layer of about 500 nm-thick and form a resist mask 31 having exposed the insulating layer in the cell forming area 5 by photolithography. With the resist mask 31 as a mask, the insulating layer of the cell forming area 5 is removed by anisotropic etching to expose the N− semiconductor layer 4 in the cell forming area 5, thereby forming a thick outer peripheral insulating film 12 on the N− semiconductor layer 4 in the outer peripheral area 6.

At P5 (FIG. 4), the resist mask 31 formed at the process P4 is removed, and the N− semiconductor layer 4 in the cell forming area 5 is thermally oxidized by the thermal oxidation method to form a gate oxide film 11 having a thickness Tg.

At this time, the amorphous layer 15 on the cell forming area 5 side adjacent to the outer peripheral insulating film 12 is subjected to speed-increasing oxidation to cause the edge portion of the gate oxide film 11 to protrude thereby forming a steplike portion 16 made thicker than the gate oxide film 11 and to oxidize the N− semiconductor layer 4 to form a concave portion 17.

At P6 (FIG. 4), after the formation of the gate oxide film 11, a polysilicon film for forming a gate electrode layer 13 is formed on the whole area of the front surface 2a side of the N− semiconductor layer 4 by a CVD method. A resist mask (not shown), which covers up to an area for forming the gate electrode layer 13, i.e., the outer peripheral edge of the gate electrode layer 13 formed on the outer peripheral insulating film 12 and which has exposed the polysilicon film for areas each having a size in which a predetermined insulating material is applied onto an area for forming each contact hole 21a, is formed on the polysilicon film by photolithography. With it as a mask, the exposed polysilicon film is etched by anisotropic etching to expose the outer peripheral insulating film 12 and form holes 35 reaching the gate oxide film 11 lying on the respective source layers 8, and to form a corresponding gate electrode layer 13 containing opposed gate electrodes 13a between adjacent cells 9 through the gate oxide film 11 interposed therebetween and extending from above the gate oxide film 11 to above the outer peripheral insulating film 12, after which the resist mask 31 is removed.

At a process P7 (FIG. 4), silicon oxide is deposited relatively thick on the whole area of the front surface 2a side of the N− semiconductor layer 4, containing the gate electrode layer 13 by the CVD method to form an interlayer insulating film 18.

At this time, silicon oxide is embedded into the corresponding holes 35 formed in the gate electrode layer 13.

At a process P8 (FIG. 4), after the formation of the interlayer insulating film 18, a resist mask 31 (not shown) having openings having exposed the interlayer insulting film 18 in the areas for forming the contact holes 21a on the respective source layers 8 and an area for forming a contact hole 21b on the outer peripheral area 6 for the gate electrode layer 13 is formed by photolithography. With it as a mask, the interlayer insulating film 18 and the gate oxide film 11 on the respective source layers 8 are etched by anisotropic etching to form the corresponding contact holes 21b and 21a that reach the gate electrode layer 13 and the source layers 8. After the removal of the resist mask 31, a conductive material is embedded into the contact holes 21a and 21b by a sputtering method or the like to form contact plugs 22a and 22b. A conductor layer formed on the interlayer insulating film 18 is patterned by photolithography to form a source electrode plug 20 electrically connected to the source layers 8 via the contact plugs 22a and to form a gate electrode plug 24 electrically connected to the gate electrode layer 13 via the contact plugs 22b.

Thereafter, a drain electrode 26 comprised of a conductive material is formed on its corresponding back surface 2b of an N+ semiconductor substrate 3 by the CVD method or the like, whereby the nMOS 1 according to the present embodiment shown in FIG. 1 is formed.

The thickness T approximately equal to that of the gate oxide film 11 is formed between the gate electrode layer 13 and the N− semiconductor layer 4 in the corresponding outer peripheral area 6 at the edge portion of the gate oxide film 11 of the so-formed nMOS 1 according to the present embodiment by means of the steplike portion 16 formed by subjecting the amorphous layer 15 to speed-increasing oxidation as shown in FIG. 2. Therefore, the insulation withstand-voltage or breakdown lifetime of the gate oxide film 11 can be improved without causing dielectric breakdown by allowing an electric field to concentrate on the edge portion of the gate oxide film 11 adjacent to the outer peripheral insulating film 12 at the portion of the rise of the gate electrode layer 13 extending from above the gate oxide film 11 in the cell forming area 5 to above the outer peripheral insulating film 12 formed in the outer peripheral area 6, thus making it possible to enhance the reliability of the nMOS 1.

In the present embodiment as described above, each of the steplike portions thicker than the gate oxide film, at which the amorphous layer formed in the N− semiconductor layer has been subjected to speed-increasing oxidation, is formed at the edge portion adjacent to the outer peripheral insulating film, of the gate oxide film. It is therefore possible to relax the electric field concentrated on the edge portion of the gate oxide film adjacent to the outer peripheral insulating film at the portion of the rise of the gate electrode layer extending from above the gate oxide film in the cell forming area to above the outer peripheral insulating film formed in the outer peripheral area and thereby prevent the dielectric breakdown of the gate oxide film and to improve the insulation withstand-voltage lifetime of the gate oxide film thereby to enhance the reliability of an nMOS.

Incidentally, although the present embodiment has explained the case in which the inert gas is injected as the amorphization impurity when the amorphous layer is formed, the amorphization impurity is not limited to the above and conductive impurities such as aluminum, phosphorus, nitrogen and the like may be adopted. If an N-type impurity such as phosphorus, nitrogen or the like is used in this case, then an amorphous layer can be formed simultaneously with a source layer when the source layer is formed, thereby making it possible to simplify a manufacturing process.

Second Preferred Embodiment

Figure 5:
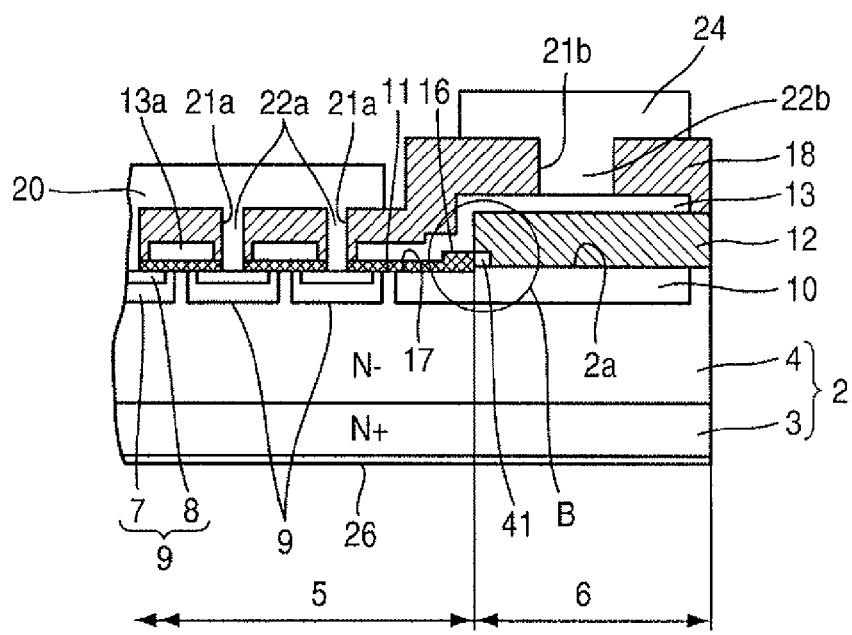
FIG. 5 is an explanatory view illustrating a partial section of a vertical nMOS transistor according to a second embodiment.
Figure 6:
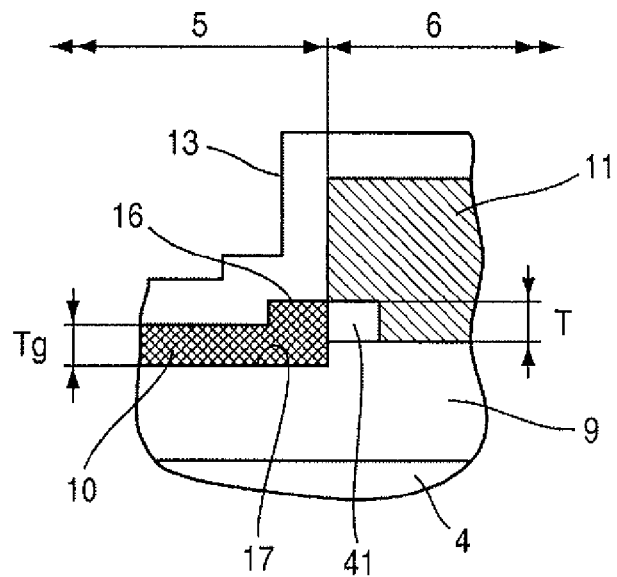
FIG. 6 is an enlarged view depicting a portion B shown in FIG. 5.
Figure 7:
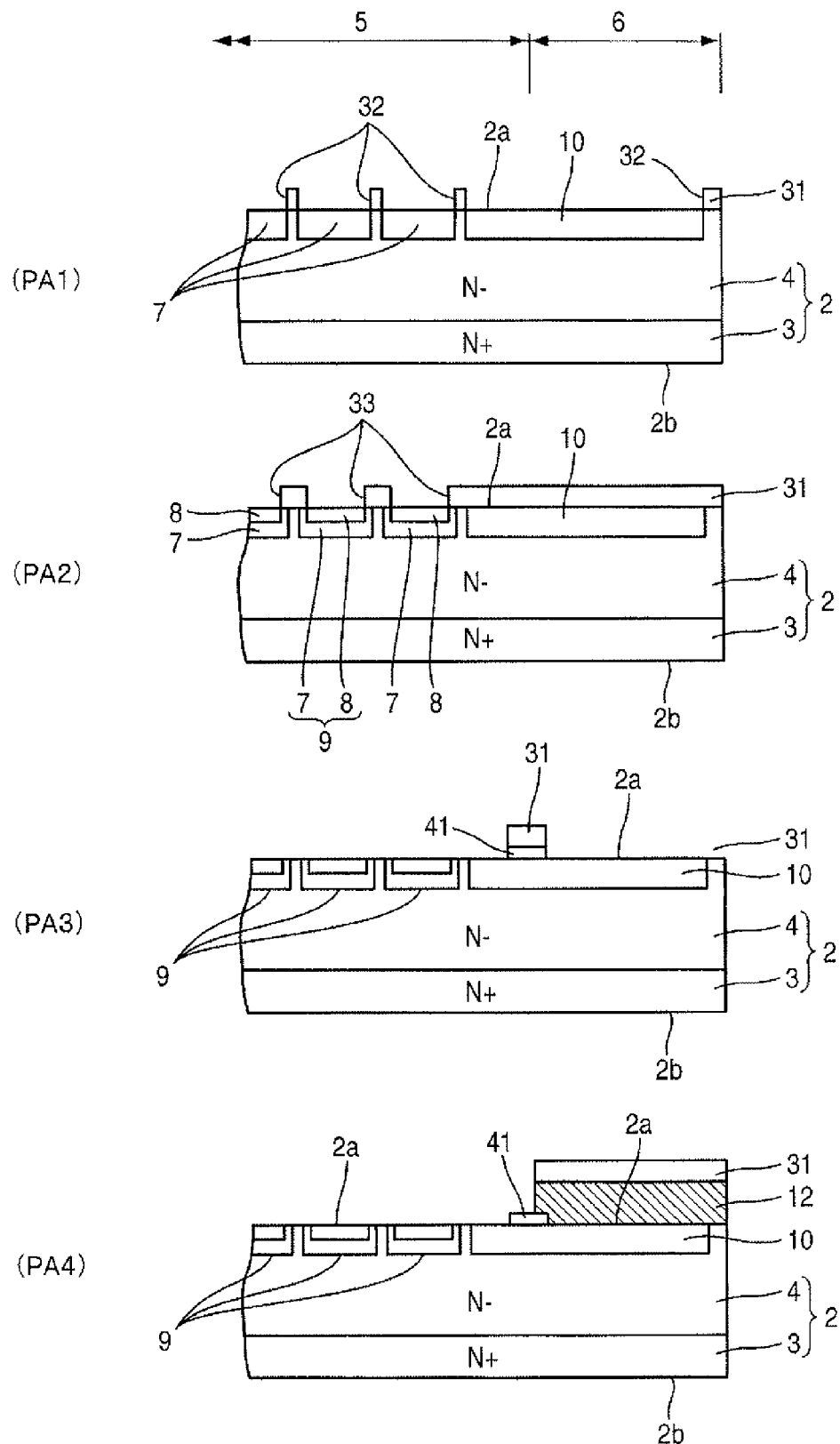
FIG. 7 is an explanatory view showing a method for manufacturing the vertical nMOS transistor according to the second embodiment.
Figure 8:
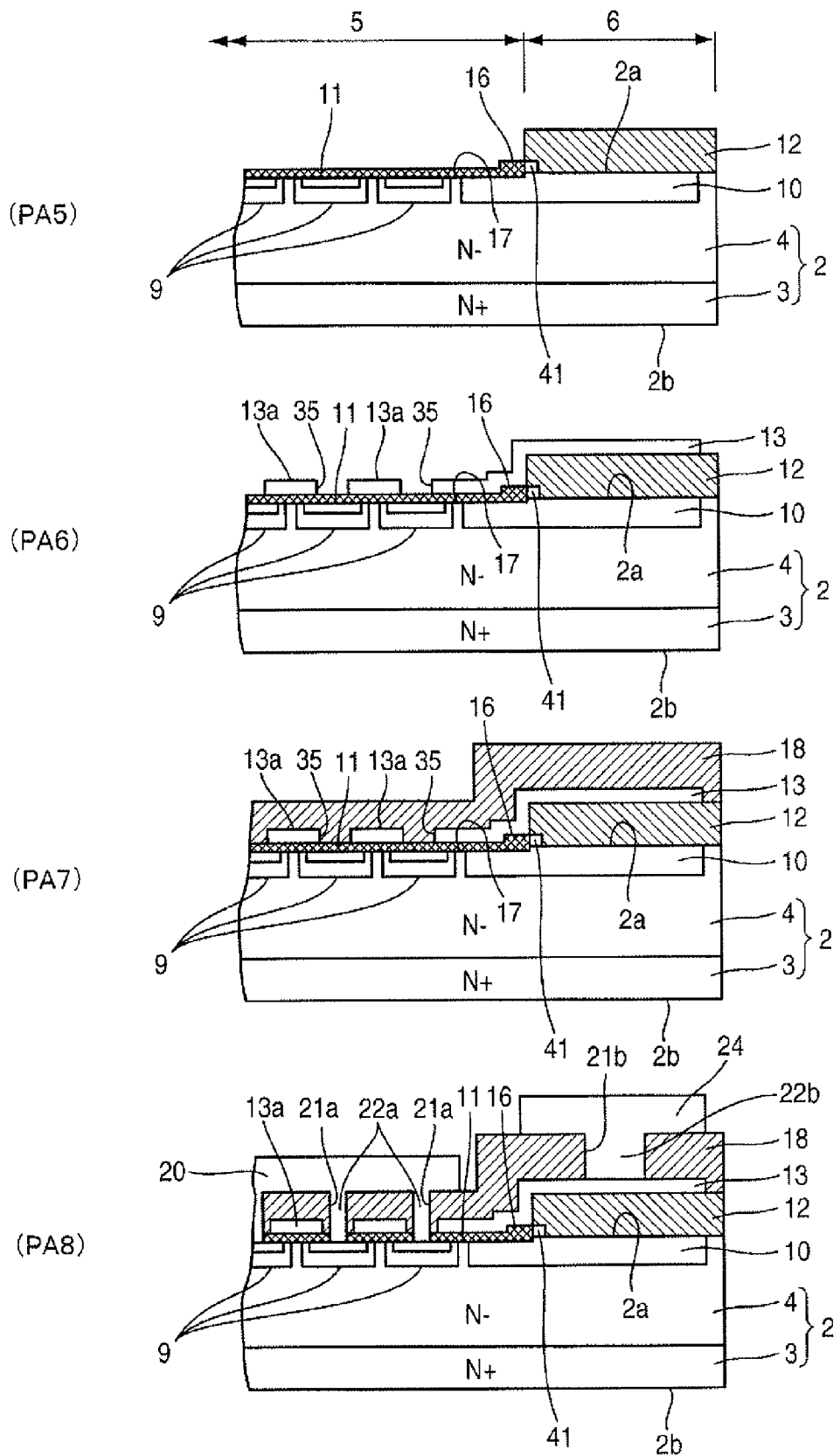
FIG. 8 is an explanatory view illustrating the method for manufacturing the vertical nMOS transistor according to the second embodiment.
Figure 9:
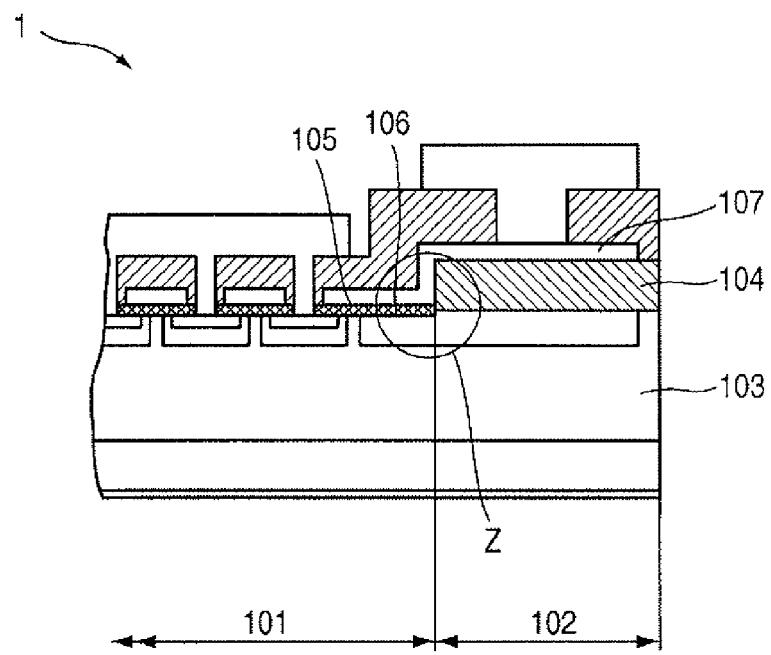
FIG. 9 is an explanatory view showing a partial section of a conventional vertical nMOS transistor.
Figure 10:
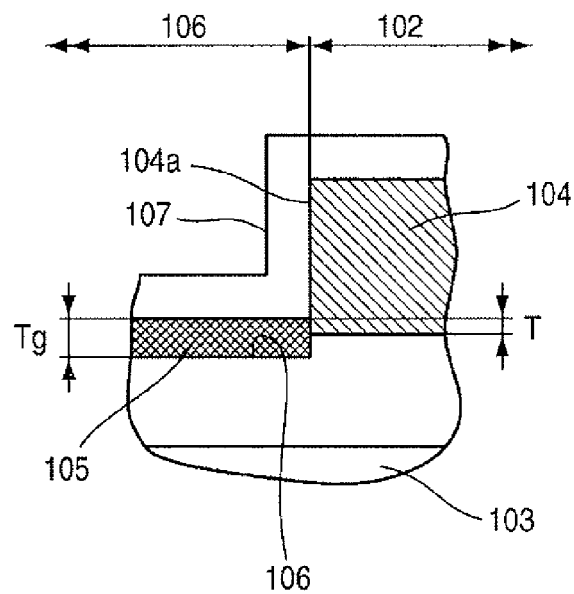
FIG. 10 is an enlarged view illustrating a portion Z shown in FIG. 9.
Figure 11:
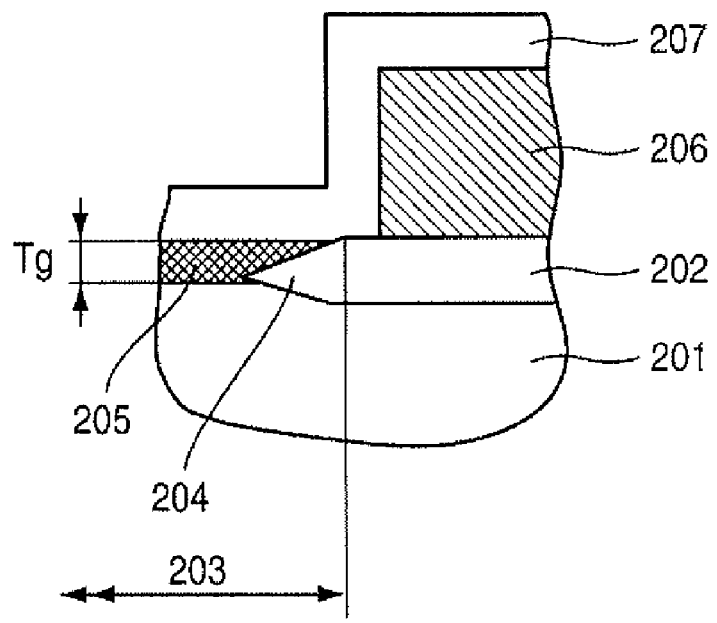
FIG. 11 is a partly enlarged view showing a gate oxide film formed in a silicon substrate.

FIG. 5 is an explanatory view showing a partial section of a vertical nMOS transistor according to a second embodiment, FIG. 6 is an enlarged view illustrating a portion B shown in FIG. 5, and FIGS. 7 and 8 are respectively explanatory views showing a method for manufacturing the vertical nMOS transistor according to the second embodiment.

Incidentally, the same reference numerals are attached to portions or components similar to those in the first embodiment, and their description will therefore be omitted.

As shown in FIGS. 5 and 6, an amorphous layer 41 according to the present embodiment is formed with a thickness approximately equivalent to a thickness Tg (50 nm in the present embodiment) of a gate oxide film 11 by depositing amorphous silicon onto a frame-shaped area set in a manner similar to the first embodiments on a front surface 2a of an outer peripheral P-well layer 10 formed in an N− semiconductor layer 4 by using a thermal CVD method (refer to FIG. 7 (PA3)). The amorphous layer 41 has a speed-increasing oxidation characteristic at thermal oxidation.

Therefore, when the front surface 2a of the N− semiconductor layer 4 is oxidized by a thermal oxidation method, a steplike portion 16 to be formed at an edge portion of the gate oxide film 11 is formed in a protruded fashion using the speed-increasing oxidation characteristic of the amorphous layer 41 placed on the front surface 2a, and has a thickness similar to the first embodiment.

A method for manufacturing the nMOS according to the present embodiment will hereinafter be explained in accordance with processes indicates by PA in FIGS. 7 and 8.

Since operations at the processes PA1 and PA2 (FIG. 7) in the present embodiment are similar to those at the processes P1 and P2 (FIG. 3) in the first embodiment, their explanations are omitted.

At PA3 (FIG. 7), a resist mask 31 formed at the process PA2 is removed and heat treatment for activation at a temperature range from about 1200° C. to 1800° C. is carried out. Thereafter, an amorphous silicon layer in which amorphous silicon is deposited with a thickness nearly equal to the thickness Tg of the gate oxide film 11, is formed by a thermal CVD method using silane ($SiH_4$). A resist mask 31 for covering a frame-shaped amorphous layer 41 forming area having a predetermined width including a boundary between a cell forming area 5 and its corresponding outer peripheral area 6 is formed on the amorphous silicon layer by photolithography. With it as a mask, the amorphous silicon layer is removed by anisotropic etching to expose the N− semiconductor layer 4, whereby an amorphous layer 41 having a thickness equivalent to about the thickness Tg of the gate oxide film 11 is formed on the front surface 2a of the outer peripheral P-well layer 10.

At PA4 (FIG. 7), the resist mask 31 formed at the process PA3 is removed and a thick outer peripheral insulating film 12 is formed on the N− semiconductor layer 4 in the outer peripheral area 6 in a manner similar to the process P4 of the first embodiment.

At PA5 (FIG. 8), a resist mask 31 formed at the process PA4 is removed, and the N− semiconductor layer 4 in the cell forming area 5 is thermally oxidized by the thermal oxidation method to form a gate oxide film 11 having a thickness Tg.

At this time, the amorphous layer 41 placed on the N− semiconductor layer 4 on the cell forming area 5 side adjacent to the outer peripheral insulating film 12 is subjected to speed-increasing oxidation to cause the edge portion of the gage oxide film 11 to protrude, whereby a steplike portion 16 made thicker than the gate oxide film 11 is formed and the N− semiconductor layer 4 is oxidized to form a concave portion 17.

Since operations at subsequent processes PA6 through PA8 (FIG. 8) are similar to those at the processes P6 through P8 (FIG. 4) of the first embodiment, their explanations are omitted.

The thickness T approximately equal to that of the gate oxide film 11 is formed between the gate electrode layer 13 and the N− semiconductor layer 4 in the corresponding outer peripheral area 6 at the edge portion of the gate oxide film 11 of the so-formed nMOS 1 according to the present embodiment shown in FIG. 5 by means of the steplike portion 16 formed by subjecting the amorphous layer 41 to speed-increasing oxidation as shown in FIG. 6. Therefore, the insulation withstand-voltage lifetime of the gate oxide film 11 can be improved without causing dielectric breakdown by allowing an electric field to concentrate on the edge portion of the gate oxide film 11 adjacent to the outer peripheral insulating film 12 at the portion of the rise of the gate electrode layer 13 extending from above the gate oxide film 11 in the cell forming area 5 to above the outer peripheral insulating film 12 formed in the corresponding outer peripheral area 6, thus making it possible to enhance the reliability of the nMOS 1.

In the present embodiment as described above, each of the steplike portions thicker than the gate oxide film, at which the amorphous layer formed on the N− semiconductor layer has been subjected to speed-increasing oxidation, is formed at the edge portion adjacent to the outer peripheral insulating film, of the gate oxide film. Thus, advantageous effects similar to those of the first embodiment can be obtained.

Incidentally, although each of the above embodiments has explained the case in which the gate electrode layer extends from above the gage oxide film to above the outer peripheral insulating film 12 and is formed over the upper full circumference of the outer peripheral insulating film, the gate electrode layer may be caused to extend only over the outer peripheral insulating film placed below the gate electrode pad.

Although each of the above embodiments has described the crystal polymorph of the silicon carbide substrate as 4H, even silicon carbide substrates shaped in the form of other crystal polymorphs such as 3C, 6H, etc., are similar.

Further, although each of the above embodiments has explained the silicon carbide semiconductor device as the vertical nMOS transistor, even a vertical pMOS transistor is similar. In this case, a P-type conductive impurity is used as the first conductivity type impurity, and an N-type conductive impurity is used as the second conductivity type impurity.

While the preferred forms of the present invention have been described, it is to be understood that modifications will be apparent to those skilled in the art without departing from the spirit of the invention. The scope of the invention is to be determined solely by the following claims.

What is claimed is:

1. A silicon carbide semiconductor device comprising:
   a semiconductor substrate comprising silicon carbide, which contains a first conductivity type impurity diffused therein in a high concentration;
   a semiconductor layer formed over the semiconductor substrate and containing the first conductivity type impurity diffused therein in a low concentration;
   a plurality of well regions formed on a front surface side of a cell forming area set to the semiconductor layer and in which a second conductivity type impurity corresponding to a type opposite to the first conductivity type impurity is diffused;
   source layers formed on the front surface side lying within the well regions and each containing the first conductivity type impurity diffused therein in a high concentration;
   an outer peripheral insulating film thick in thickness, which is formed over the semiconductor layer in an outer peripheral area surrounding the cell forming area;
   a gate oxide film formed over the front surface of the semiconductor layer in the cell forming area; and
   a gate electrode layer formed so as to extend from above the gate oxide film to above the outer peripheral insulating film,
   wherein each of steplike portions adjacent to the outer peripheral insulating film and thicker than the gate oxide film in thickness is provided at an edge portion of the gate oxide film.

2. The silicon carbide semiconductor device according to claim 1, wherein the gate oxide film is a thermal oxide film.

3. The silicon carbide semiconductor device according to claim 1, wherein the first conductivity type is N-type, and the silicon carbide semiconductor device is a vertical nMOS transistor.

4. The silicon carbide semiconductor device according to claim 1, wherein a thickness of steplike portions of the gate oxide film is less than the thickness of the outer insulating film.

5. The silicon carbide semiconductor device according to claim 1, wherein gate electrode layer includes a steplike portion conforming to the steplike portion of the gate oxide film.

6. The silicon carbide semiconductor device according to claim 1, wherein the gate electrode layer extends over a source layer adjacent the outer peripheral area, and wherein the device further comprises a plurality of additional gate electrodes located between respective source layers which are not adjacent the outer peripheral area.

7. The silicon carbide semiconductor device according to claim 6, further comprising a source electrode pad which is electrically connected to the plurality of source layers.

* * * * *